United States Patent [19]
Bertin et al.

[11] Patent Number: 5,617,351
[45] Date of Patent: Apr. 1, 1997

[54] THREE-DIMENSIONAL DIRECT-WRITE EEPROM ARRAYS AND FABRICATION METHODS

[75] Inventors: Claude L. Bertin, South Burlington, Vt.; Donelli J. DiMaria, Ossining, N.Y.; Makoto Miyakawa; Yoshinori Sakaue, both of Tokyo, Japan

[73] Assignee: International Business Machines Corporation, Armonk, N.Y.

[21] Appl. No.: 464,018

[22] Filed: Jun. 5, 1995

Related U.S. Application Data

[63] Continuation of Ser. No. 850,734, Mar. 12, 1992, Pat. No. 5,467,305.

[51] Int. Cl.⁶ .................................................. G11C 16/04
[52] U.S. Cl. ............................ 365/185.05; 365/185.01; 365/185.08; 365/149; 365/195; 365/185.14; 257/298; 257/302; 257/319; 257/320
[58] Field of Search ................. 365/185.01, 185.08, 365/185.05, 185.14, 149, 195; 257/298, 302, 319, 320

[56] References Cited

U.S. PATENT DOCUMENTS

| | | |
|---|---|---|
| 4,471,471 | 9/1984 | DiMaria .................................. 365/149 |
| 4,929,988 | 5/1990 | Yoshikawa . |
| 4,990,979 | 2/1991 | Oito . |
| 5,017,977 | 5/1991 | Richardson . |
| 5,049,956 | 9/1991 | Yoshida et al. . |
| 5,053,842 | 10/1991 | Kojima . |
| 5,196,722 | 3/1993 | Bergendahl et al. ................... 257/320 |

FOREIGN PATENT DOCUMENTS

| | | |
|---|---|---|
| 60-38881 | 2/1985 | Japan . |
| 61-131484 | 6/1986 | Japan . |

OTHER PUBLICATIONS

Y. Yamauchi et al., "A 4Mbit NVRAM Tech. Using a Novel Stacked Cap. on Sel. Self–Align. Flotox Cell Str.," 1990 I.E.O.M., pp.931–933.

Y. Terada et al., "High Speed Page Mode Sens. Sch. for EPROM's and Flash EEPROMs Using Divided Bit Line Arch.," 1990 Symp. on VLSI Crts, pp. 97–98.

*Primary Examiner*—Joseph E. Clawson, Jr.
*Attorney, Agent, or Firm*—Heslin & Rothenberg, P.C.

[57] ABSTRACT

A three-dimensional memory cell, suitable for electrically erasable programmable read only memories (EEPROMS), which has direct-write cell capability is disclosed. The memory cell is utilized in the fabrication of non-volatile, direct-write EEPROM arrays with high integration density. A typical EEPROM array includes a plurality of elongated shallow trenches formed in a semiconductor substrate. Multiple direct-write EEPROM cells are disposed within each elongated trench such that each EEPROM cell shares a recall gate and a program gate with another cell in the same trench. Preferably, a silicon rich dielectric (such as silicon rich oxide) disposed between each floating gate and its associated programming and recall gates. Both common source diffusion and isolated source diffusion embodiments are disclosed. Further, various fabrication methods for the direct-write EEPROM arrays presented are described.

23 Claims, 7 Drawing Sheets

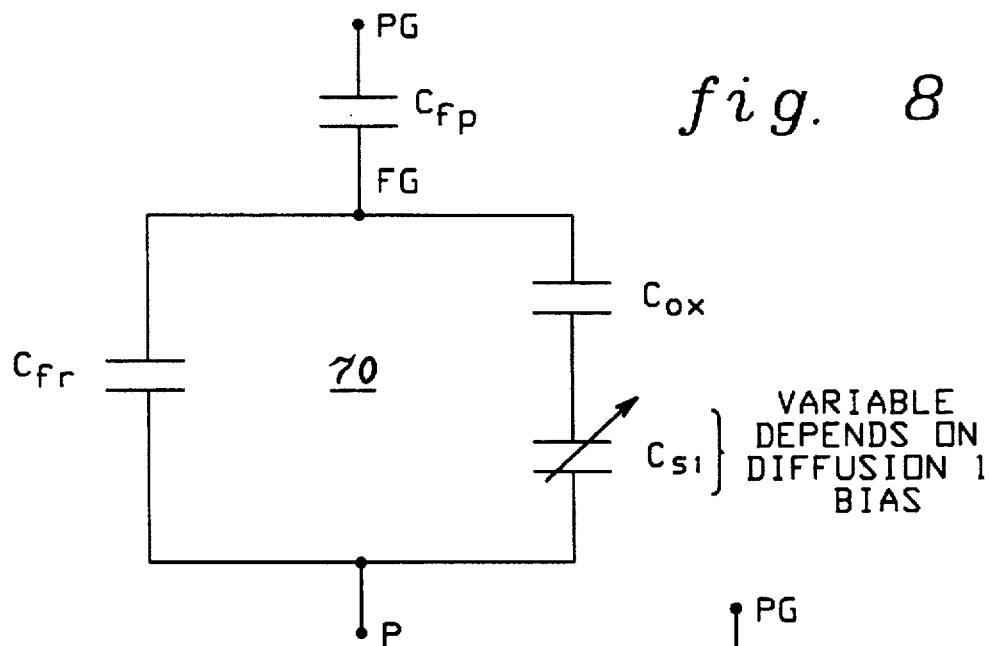
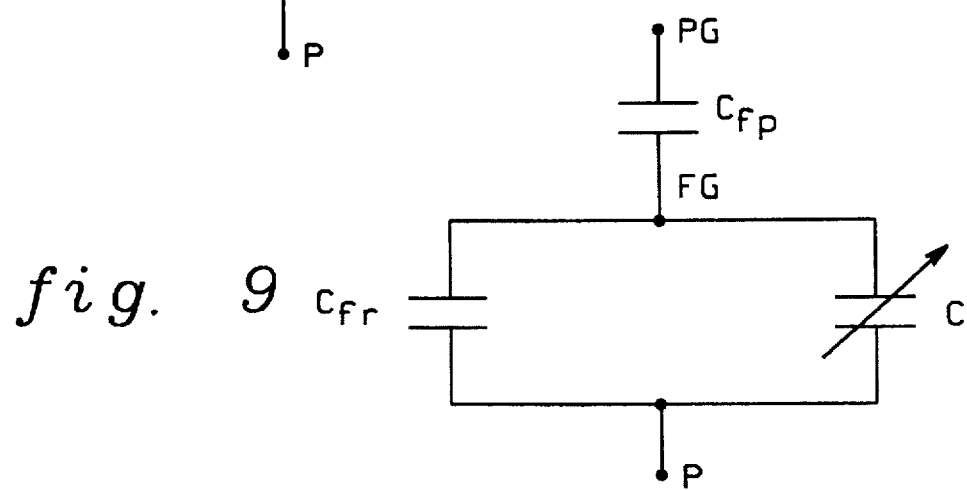
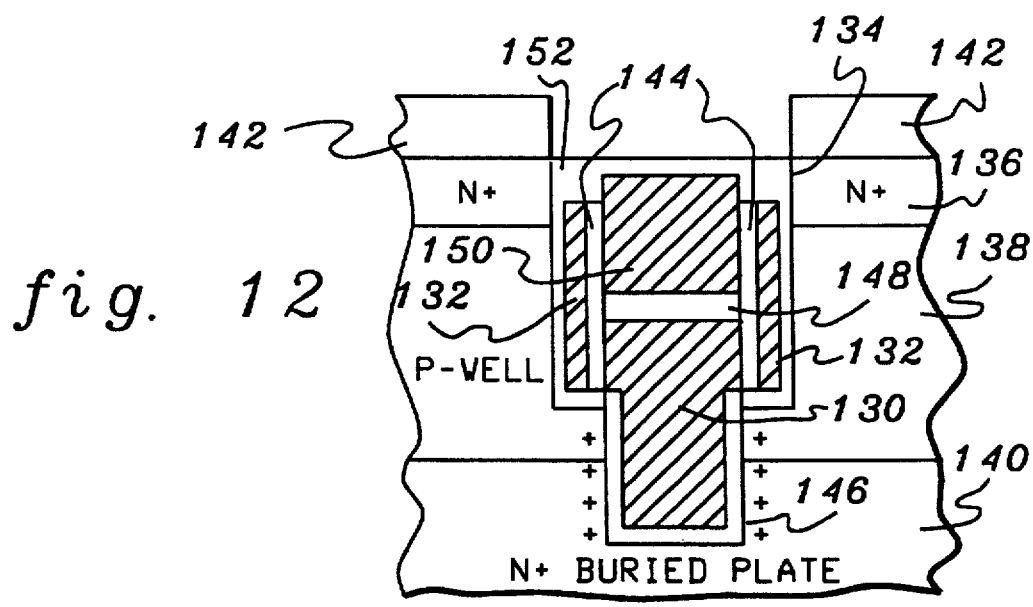

THREE-DIMENSIONAL DIRECT-WRITE EEPROM ARRAYS AND FABRICATION METHODS

This application is a continuation, of application Ser. No. 07/850,734, filed Mar. 12, 1992, now U.S. Pat. No. 5,467, 305.

CROSS-REFERENCE TO RELATED APPLICATION

This application contains subject matter which is related to the subject matter of an application filed on even date herewith and assigned to the same assignee entitled "Shadow RAM Cell Having a Shadow Trench EEPROM" by Bergendahl et al., Ser. No. 848,913 (now U.S. Pat. No. 5,196,722 issued on Mar. 23, 1993).

TECHNICAL FIELD

The present invention relates in general to semiconductor memory devices suitable for electrically erasable programmable read only memories (EEPROMs), and more particularly, to non-volatile, three-dimensional, direct-write EEPROM arrays with high integration density and to fabrication methods thereof.

BACKGROUND ART

Non-volatile floating gate MOS memories are well known in the industry. In such devices, the conductive state of the transistor memory cell is determined by the voltage of the associated floating gate. Typically, a negatively charged floating gate is representative of a binary one state, while an uncharged floating gate is representative of a binary zero state.

More particularly, a conventional electrically programmable read only memory (EPROM) utilizes a floating (unconnected) conductive gate, in a field effect transistor structure positioned over but insulated from a channel region in a semiconductor substrate disposed between source and drain regions. A control gate (or program gate) is then provided over the floating gate (FG), but also insulated therefrom. The threshold voltage ($V_T$) characteristic of the transistor is controlled by the amount of charge that is retained on the floating gate. That is, the minimum amount of voltage (threshold) that must be applied to the control gate before the transistor is turned "on" to permit conduction between its source (recall gate) and drain (diffusion) regions is controlled by the level of charge on-the floating gate (FG). A transistor is traditionally programmed to one of two states by accelerating electrons from the substrate channel region, through a thin gate dielectric and onto the floating gate.

The memory cell transistor's state is read by placing an operating voltage across it's source and drain and on it's control gate, and then detecting the level of current flow in between the source and drain as to whether the device is programmed to be "on" or "off" at the control gate voltage selected. A specific, single cell in a two-dimensional array of EPROM cells is addressed for reading by application of a source—drain voltage to the source and drain lines in a column containing the cell being addressed, and the application of a control gate voltage to the control gates in a row containing the cell being addressed.

In addition to the floating and control gates, an erase gate is conventionally included. The erase gate passes through each memory cell transistor closely adjacent to a surface of the floating gate but insulated therefrom by a thin tunnel dielectric. Charge is then removed from the floating gate of the cell to the erase gate when appropriate voltages are applied to all of the transistor elements. An EEPROM is a read only memory device in which the stored data may be erased and new data written instead. A widely used type of EEPROM is the floating gate field effect transistor type (see U.S. Pat. No. 5,017,977 entitled "Dual EPROM Cells On Trench Walls With Virtual Ground Buried Bit Lines"). An array of EEPROM cells is commonly referred to as a "flash" EEPROM array if the entire array of cells, or a significant group of the cells, is simultaneously erasable (i.e., in a flash).

Conventionally, to write data into a memory cell, the cell must first be erased and then written. Each of these operations takes one machine cycle, e.g., 10 milliseconds, and each requires a significant external voltage supply, such as 15–20 volts. Decoder circuits are used to sustain the needed high voltages at the appropriate cells. These high voltage circuits generally do not scale down in size with the decreasing line widths now attainable with ever improving lithographic techniques. (By comparison, to read a device typically requires only three to five applied volts and read cycle time is measured in nanoseconds.) Further, the need to erase floating gates prior to writing data therein for storage obviously adversely effects the operational speed of an array of these memory cells.

The semiconductor industry generally accepts that direct-write EEPROMs will replace both UV-erase EPROMs and flash-EEPROMs to become the main stream silicon non-volatile memory of future memory cell generations beyond 0.5 µm echnology, i.e., if direct-write EEPROM devices can equal flash-EEPROM devices in density while still maintaining the re-programming flexibility of EEPROMs. Scaling of direct-write EEPROM first gate oxide results in thickness approaching the tunnel oxide (10 nm) of EEPROMs which provides a more flexible and less expensive reprogramming capability than the UV erasure required by traditional EPROMs.

One goal in the fabrication of integrated circuitry is to produce a circuit having maximum circuit density. This goal extends to the fabrication of EEPROMs. Significant increases in the direct-write EEPROM memory market are anticipated over the next decade. Many industry experts believe that direct-write EEPROMs will very likely replace magnetic storage media sometime in the near future. Any device/fabrication technique improvements which produce a denser memory array with reduced power requirements and improved performance characteristics will therefore have a significant impact in the industry.

DISCLOSURE OF INVENTION

Briefly described, the present invention comprises in one aspect a direct-write EEPROM memory array formed in association with a semiconductor substrate. The memory array includes at least one elongated trench formed in the substrate. At least two three-dimensional direct-write EEPROM cells are disposed in the elongated trench and each EEPROM cell is paired with another of the EEPROM cells in the trench. At least one control gate is disposed within the elongated trench and each EEPROM cell pair shares a common control gate. In enhanced embodiments, multiple vertical EEPROM cells are disposed in each of a plurality of elongated trenches, again with each EEPROM cell being paired with another of the EEPROM cells in the corresponding trench, each pairing of EEPROM cells sharing a common control gate. Further specific details of this aspect of the invention are described and claimed herein.

In another aspect, a memory cell array formed relative to a surface of a semiconductor substrate is provided wherein at least two elongated, substantially parallel trenches are formed in the surface of the substrate. Each of the elongated trenches has a bottom portion, first and second side portions, and a top portion. At least two first electrodes are provided with each electrode being disposed at a bottom portion of one of the elongated trenches such that each trench contains a first electrode. Each first electrode has a first surface portion. At least two second electrodes are also provided, each of which is disposed at a first side portion of one of the elongated trenches such that each trench contains a second electrode. Each of the second electrodes has a second surface portion disposed adjacent the first surface portion of a respective one of the first electrodes for receiving injected electrons therefrom, and each has a third surface portion. At least two third electrodes are further provided, and each of the third electrodes is disposed at the second side portion of one of the elongated trenches such that each trench contains a third electrode. Each of the third electrodes also has a second surface portion disposed adjacent the first surface portion of a respective one of the first electrodes for receiving injected electrons therefrom. In addition, each third electrode includes a third surface portion. At least two fourth electrodes are also provided. Each of the fourth electrodes is disposed at an upper surface portion of one of the elongated trenches such that each trench contains a fourth electrode, and each has a fourth surface portion disposed adjacent the third surface portions of respective ones of the second and third electrodes for receiving electrons injected therefrom. Finally, an elongate diffusion region is provided disposed between adjacent ones of the at least two elongated trenches. The elongate diffusion region is coupled to a signal source. In one preferred embodiment, the first electrode comprises a recall gate, the second and third electrodes the floating gates of adjacently paired EEPROM cells, and the fourth electrode a control gate for the two paired EEPROM cells.

In another aspect of the present invention, a manufacturing method is provided for producing a semiconductor device memory array. The method begins with provision of a substrate of a first conductivity type material having a first surface. The substrate is assumed to include a buried plate having a higher concentration of the first conductivity type material. A well of a second conductivity type material is defined in the substrate from the first surface and the well is configured to extend to the buried plate in the substrate. A diffusion region of first conductivity material is then defined in the well of second conductivity type material from the first surface of the substrate. A trench mask having an elongated opening is formed on the first surface of the substrate. The elongated opening is aligned over the first surface of the substrate such that the diffusion region of first conductivity type in the well of second conductivity type material is at least partially disposed under the trench mask adjacent the elongated opening in the mask. A trench is etched in the semiconductor material through the elongated mask openings to extend through the well of second conductivity material to contact the buried plate of first conductivity type material in the substrate. Exposed silicon in the formed trench is then oxidized and a polysilicon structure is formed in a bottom portion of each trench as a base for a continuous recall gate to extend throughout the trench. Next, a polysilicon layer is deposited and recessed to form at least two sidewall floating gates having top and side surfaces. The top surface of each floating gate overlaps at least partially the diffusion region of first conductivity type material disposed within the well of second conductivity type material. A spacer of silicon rich dielectric material is then formed on each side surface of the at least two floating gates. A polysilicon extension of the recall gate is disposed to extend partially up the silicon rich dielectric layer on each of the floating gate side surfaces. An insulator is disposed on top of the recall gate extension and a polysilicon program gate is formed on the upper surface of the insulator such that the program gate is disposed in an upper portion of the elongated trench. Further process enhancements are also provided and claimed herein.

To summarize, non-volatile, three-dimensional, direct-write EEPROM cells/arrays and fabrication methods thereof are presented. Because the EEPROM memory cells/arrays are direct-write, no erase cycle is required. Further, operation of the novel cell/array only requires a low standard voltage supply, e.g., approximately 3–5 volts applied to the diffusions. Control and recall gates require higher voltages (15 volts typically) which can be generated on-chip because of their limited current draw. A silicon rich dielectric (such as silicon rich nitride) is employed to increase the local fields for a given voltage, thus allowing lower power supply voltages to be applied to the control and recall gates while still inducing Fowler-Nordheim tunneling for programming and reprogramming of the floating gates. This allows the lowest possible power consumption and reduced average oxide electric fields (in comparison with hot electron writing of cells).

In addition, the three-dimensional structure is much denser than any EEPROM array attainable with a two-dimensional, horizontal-type implementation. Further, capacitive modulation of the substrate facilitates large changes in the floating gate to substrate capacitance. In a shared diffusion type embodiment, the recall gate is utilized to isolate the floating gate and break any potential path of current to the substrate. High write performance is attainable with the combination of high local fields and low average power fields. In certain embodiments, a single non-erodible mask can be used in an EEPROM array fabrication process pursuant to the present invention.

BRIEF DESCRIPTION OF THE DRAWINGS

These and other objects, advantages and features of the present invention will be more readily understood from the following detailed description of certain preferred embodiments thereof, when considered in conjunction with the accompanying drawings in which:

FIG. 2b is a top plan view of the direct-write EEPROM memory array of FIG. 2a;

FIG. 8 is a schematic representation of the capacitive coupling effects identified in FIG. 7;

FIG. 9 is a simplified schematic of the capacitive coupling circuit of FIG. 8;

FIG. 10b is a partial top plan view of the direct-write EEPROM memory array of FIG. 10a;

FIG. 12 is a partial cross-sectional view of an alternate embodiment of a three-dimensional, EEPROM trench structure pursuant to the present invention.

BEST MODE FOR CARRYING OUT THE INVENTION

Reference is now made to the drawings in which the same reference numbers are used throughout the different figures to designate the same or similar components.

A conventional two-dimensional EEPROM array utilizes two devices per memory cell, one device is a select transistor and the other comprises a storage transistor. Typically, a thin oxide tunneling device is utilized between diffusion and floating gates of the cell. Such a two-dimensional EEPROM array is organized so that individual cells can be erased and programmed. Products are organized as byte and/or page write from an erase and from a write standpoint. In comparison, in a conventional flash-EEPROM embodiment, a common source diffusion facilitates the common erase of an entire chip or a large block of a chip, e.g., 64k bytes. Write is channel hot electron and the function consumes a high level of power which limits the write operation to one or at most 8 bytes. Page mode write is impractical because of the power limitations. Basically, memory cell density/productivity is achieved at the expense of byte or page organization.

Figure 1:
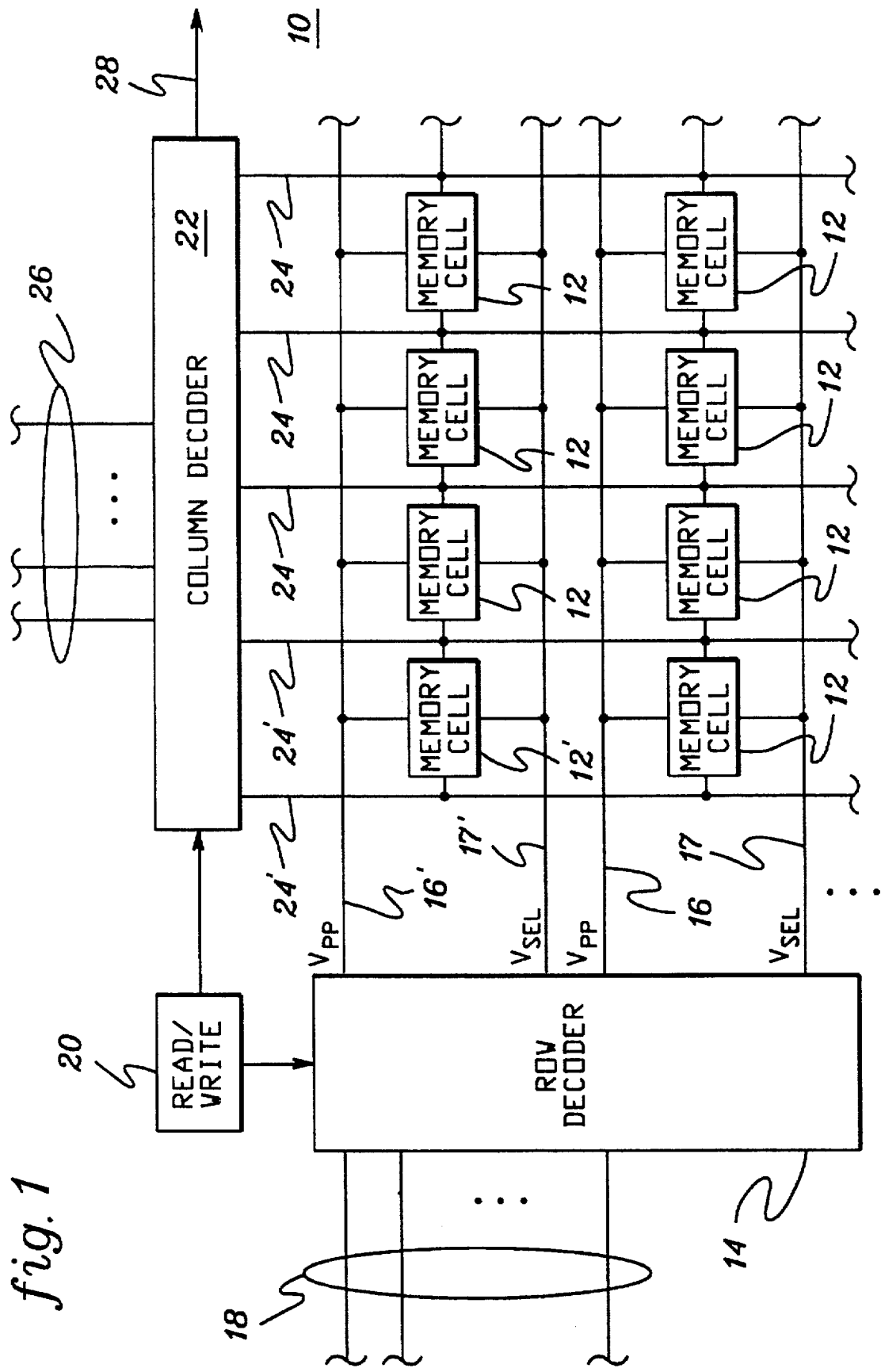
FIG. 1 is a partial schematic of a semiconductor device memory array utilizing floating gate field effect transistors pursuant to the present invention.

A partial schematic diagram of an integrated circuit direct-write EEPROM array, denoted 10, using floating gate field effect transistors pursuant to the present invention is shown in FIG. 1. Generally, in one embodiment, two devices per memory cell are used to secure byte and/or page organization of the resultant memory array. Poly-poly write is introduced inside a substrate well using silicon rich dielectric (such as silicon rich nitride (SRN)) injectors which locally enhance the electric field, allowing cell operation with a lower average electric field, and therefore a lower average voltage between poly to poly diffusions. There is no thin oxide required between the floating gate and the sidewall channels, and direct-write is possible so that no erase operation is required. In this first embodiment, adjacent diffusions are shared to maximize density, which requires that a recall gate be used to inhibit write and read (described below). This inhibiting function is assisted by the use of two channel control voltages $V_{t1}$ and $V_{t2}$ in the sidewall channel.

In an alternate embodiment, the memory cells are the same as just described except adjacent diffusions are no longer shared. This separation of diffusions eliminates the need for a recall gate inhibit function during the read or write operation. Further, there is no need for turn on voltage tailoring of the adjacent vertical substrate channel, although characteristics of cell operation are similar to those of the first embodiment. The resultant memory cell is slightly larger than the shared diffusion cell, but it is still much denser than a flash-EEPROM cell and has all the advantages of an EEPROM cell in terms of byte/page organization, with lower power requirements and more cyclability than a flash-EEPROM. Each invention embodiment will be described in detail herein.

Memory cells 12 (& 12') each include floating gate field effect transistors. A row decoder 14 provides output signals $V_{PP}$ (programming voltage) and $V_{SEL}$ (select transistor voltage) on a plurality of row lines 16 (& 16') and 17 (& 17'), respectively, in response to signals provided on row address input leads 18 and from a read/write indicator 20. A column decoder 22 provides and receives signals on a plurality of column lines 24 (& 24') in response to signals provided on column address input leads 26 and read/write indicator 20. A memory output signal is provided by decoder 22 on an output lead 28.

A data bit stored in, for example, memory cell 12' is read by providing a high voltage output signal on the corresponding $V_{PP}$ and $V_{SEL}$ row lines 16' & 17' and providing a low voltage output signal on all other row lines 16 & 17. Column decoder 22 then senses, via the corresponding column lines 24', the impedance of memory cell 12'. If the floating gate memory of memory cell 12' contains excess electrons, then the negative charge of the excess electrons raises the threshold voltage of memory cell 12' so that the voltage provided on the corresponding row lines 16' & 17' is insufficient to cause the channel of memory cell 12' to conduct. Therefore, column decoder 22 detects a high impedance and provides an appropriate signal on output lead 28. Conversely, if there are no excess electrons stored on the floating gate of memory cell 12', then the voltage supplied on the corresponding row lines 16' & 17' is sufficient to cause memory cell 12' to conduct. Therefore, column decoder 22 detects a low impedance and provides the appropriate signal on output lead 28.

EEPROM array 10 is thus programmed by negatively charging the corresponding floating gates of selected memory cells (12). This is accomplished by injecting electrons across an insulating layer surrounding the floating gate, conventionally from the substrate of the memory cell.

Figure 2A:
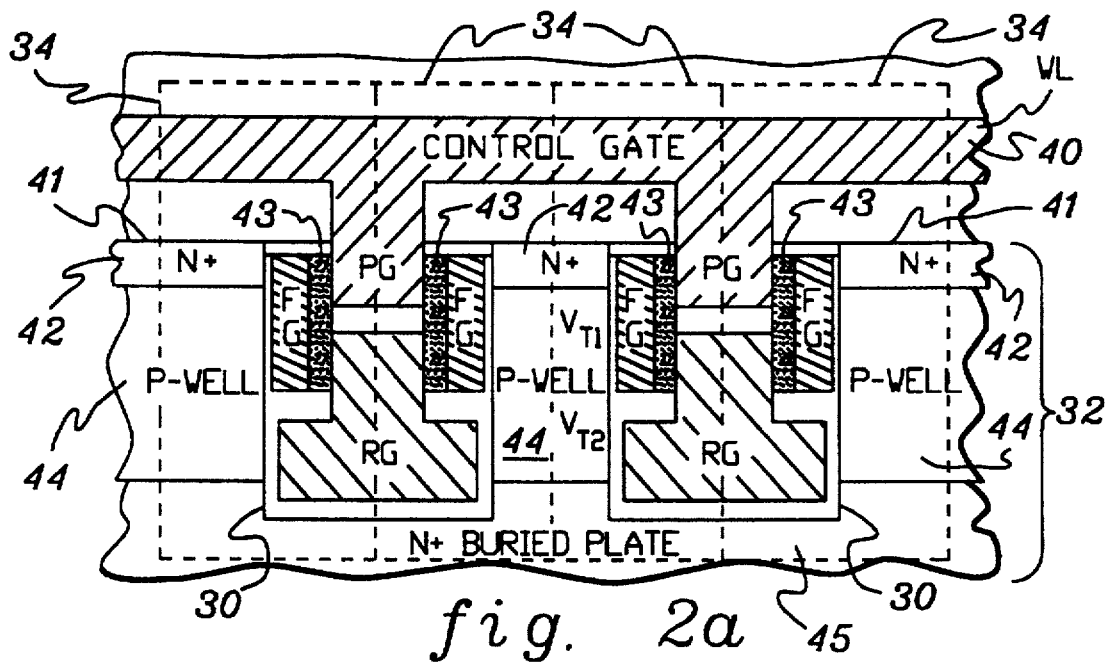
FIG. 2a is a partial cross-sectional view of one embodiment of a direct-write EEPROM memory array pursuant to the present invention.
Figure 2B:
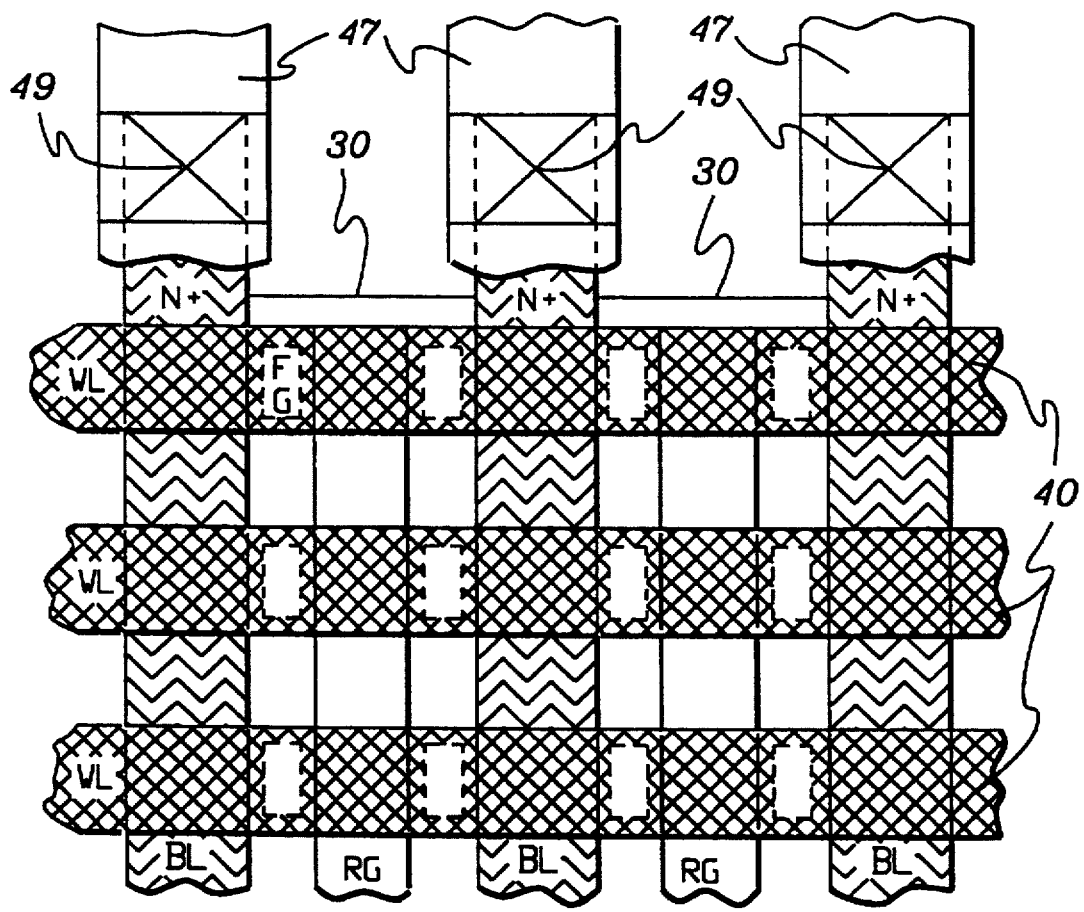

FIGS. 2a & 2b depict a partial cross-sectional view and corresponding partial plan view Of one embodiment of a direct-write EEPROM product array pursuant to one embodiment of the present invention. In one aspect, the present invention employs a plurality of shallow trenches 30 in a substrate material 32. Each trench is sized and configured to accommodate at least one three-dimensional (i.e., vertically constructed) direct-write EEPROM memory cell 34. Several memory cells 34 are outlined in phantom in the cross-sectional view of FIG. 2a.

A continuous recall gate (RG) is disposed in a bottom portion of each shallow trench 30. Discrete floating gates (FG) are provided along a first sidewall portion and a second sidewall portion of each of the trenches as shown. Preferably, a plurality of floating gate (FG) structures are defined along the length of each side wall of the elongate, substantially parallel trenches (FIG. 2b). Each floating gate structure defines in combination with the surrounding substrate, the continuous recall gate (RG) and an associated program gate (PG), an EEPROM memory cell 34 pursuant to the present invention. The program gates (PG), which are provided in an upper portion of each of the trenches, are each associated with a pair of floating gates (FG) (i.e., a first floating gate along a first sidewall portion of each trench and a second floating gate along a second sidewall portion of the trench). The program gates are coupled together via a control gate or wordline (WL) 40 (see FIG. 2b), which run orthogonal to the elongated trenches.

A common (N+) diffusion 42 is provided in substrate 32 at an upper surface 41 of the substrate between adjacent elongated trenches 30. Diffusions 42 comprise shared sources (or drains) which define bitlines (BL) to be used in combination with the wordlines (WL) interconnecting the program gates to select individual EEPROM memory cells. Diffusions 42 reside within a P-well 44 initially formed in substrate 32 from surface 41. Preferably, region 44 extends to contact an N+ buried plate 45 in the substrate. Bitline straps 47 are connected at various locations 49 to each common diffusion 42. (Those skilled in the art will recognize that the various conductivity types (P,N) provided with the examples herein set forth could be uniformly exchanged in a circuit array without departing from the present invention.)

In addition to the vertical disposition of multiple EEPROM memory cells in parallel formed trenches in the semiconductor substrate, each direct-write EEPROM cell is preferably fabricated to contain a silicon rich dielectric (e.g., silicon rich nitride or silicon rich oxide) as the insulative material 43 between adjacent surfaces of the recall gate (RG) and the associated floating gates (FG), and correspondingly between each floating gate (FG) in a trench and its respective program gate (PG). The silicon rich dielectric (SRD) allows Fowler-Nordheim electron tunneling effects between the various recall gates and their associated floating gates and, correspondingly, between the various floating gates and their associated program gates. Therefore, the voltage necessary to transfer electrons onto and from the floating gates is advantageously minimized.

In a direct-write EEPROM memory array structure such as that depicted, the shallow trenches 30 are spaced as close together as possible. Also, the recall gates (RG) function during a read cycle, and as a vertical channel inhibit gate. Each recall gate (RG) runs inside and parallel to each trench as shown in FIGS. 2a & 2b. (The tunneling mechanism of electrons according to Fowler-Nordheim takes place between the recall gate (RG) and an associated floating gate (FG), and is controlled by the voltage difference therebetween. The voltage difference is determined by the capacitance ratios between these two gate structures. The absence or presence of diffusion capacitance in the P-well substrate modulates the capacitance value and therefore the voltage difference between these two poly gates via modulation of the cell coupling ratio.) The N+ diffusions are even with the trench walls and are common to many EEPROM devices (FIG. 2b), which is to enhance array density. Bitline connections are made as shown in FIG. 2b. Since each trench utilizes a single wordline for two paired floating gates of the EEPROM memory array, N+ diffusions 42 on either side of each trench must go to different contact points. One preferred technique for fabricating a 'shared-diffusion' type EEPROM memory device such as that presented in FIGS. 2a & 2b is next described in connection with the cross-sectional views of FIGS. 3–6, which progressively partially depict the EEPROM product at various stages in a fabrication process pursuant to the present invention.

Figure 3:
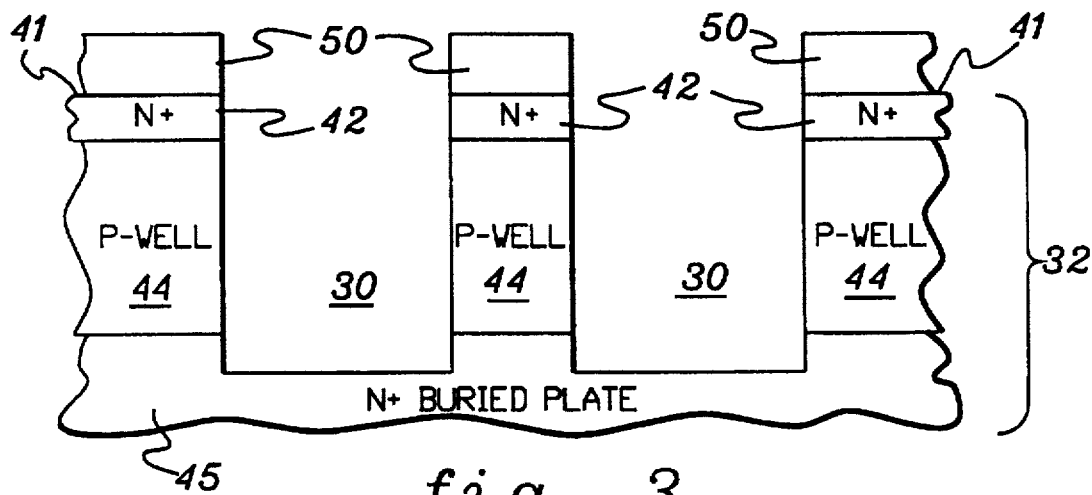
FIG. 3 is a partial cross-sectional view of a semiconductor structure attained in an initial stage of fabrication processing (pursuant to the present invention) of an EEPROM memory array such as that depicted in FIGS. 2a & 2b.

In FIG. 3, substrate 32 has been conventionally processed to include N+ buried plate 45 which is contacted by P-well 44 located adjacent upper surface 41 of the substrate. N+ diffusion 42 has also been placed within P-well 44 extending therein from upper surface 41. Formed within substrate 32, again from its upper surface 41, are a plurality of elongated, shallow trenches 30. This is accomplished by employing a first mask 50, e.g., composed of a non-erodible material or a combination of non-erodible materials, formed on the upper surface 41 of substrate 32. By way of example, the mask may comprise aluminum oxide or a thick pad of nitride, or it could even be a series of selectively erodible materials such that as each processing step takes place a layer of the mask is removed until the last step of the process when the final layer of the mask is eliminated, thereby producing the completed device. A multiple layer resist structure is used to define a pattern in the non-erodible material. (The layout of the EEPROM trench image is as shown in the plan view of FIG. 2b.)

After the EEPROM trench mask (not shown) is defined and used to etch through the non-erodible material 50, the elongated, shallow trenches 30 are formed in the substrate. Specifically, each EEPROM trench is preferably etched to a depth below the level of P-well 44, using trench mask 50. This etching can be done by reactive ion etching (RIE) with a mixture such as $CF_4$ plus oxygen, which etches both silicon and silicon oxide at about the same rate.

Figure 4:
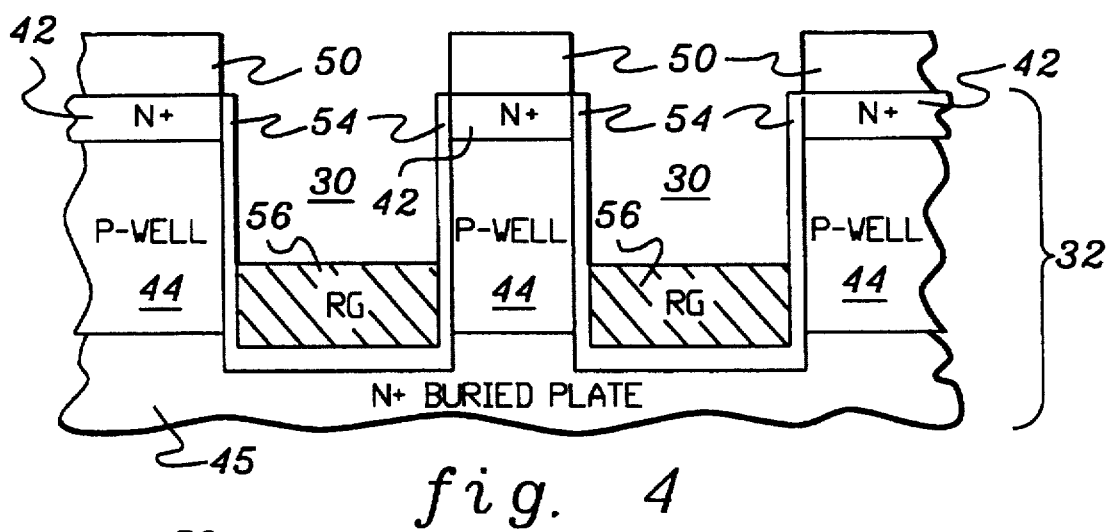
FIG. 4 is a partial cross-sectional view of the semiconductor structure of FIG. 3 subsequent additional fabrication processing pursuant to the present invention.
Figure 5:
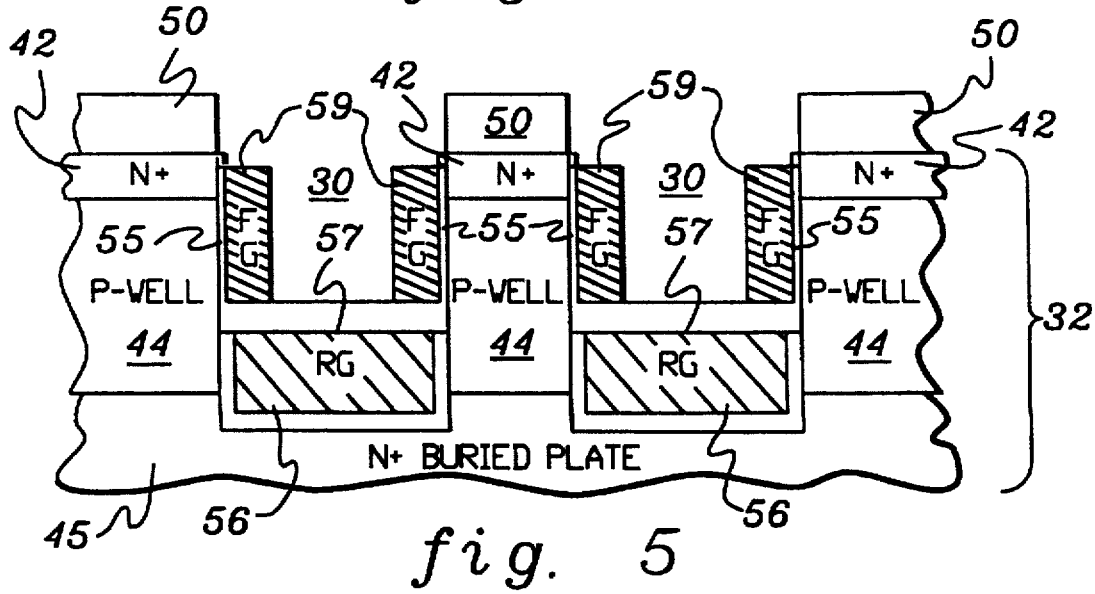
FIG. 5 is a partial cross-sectional view of the semiconductor structure of FIG. 4 subsequent additional fabrication processing pursuant to the present invention.

Next, the exposed silicon and polysilicon surfaces of the trench are oxidized for protection (by processing well known in the art) to produce a silicon oxide layer 54, e.g., about 300 Å thick, wherein each trench is about 2 microns deep and 2 microns wide (see FIG. 4). The recall gate polysilicon 56 is next deposited to fill each trench, and planarized by a suitable means (e.g., chemical-mechanical polishing) flush with non-erodible mask 50. The polysilicon fill is subsequently recessed back by a timed etch to a level such as that shown in FIG. 4, i.e., to a level a device length above the boundary between P-well 44 and N+ buried plate 45. The sidewall oxide 54 which has been uncovered by the polysilicon fill etching process within the trench is stripped and the silicon surfaces of the P-well are re-oxidized to form a gate oxide 55, for example, of 200 Å thickness. As shown in FIG. 5, this re-oxidation process also oxidizes the top surface 57 of the recall gate (RG) polysilicon 56. The oxidation grows three times more oxide on the polysilicon surfaces than on the single crystal surfaces, a feature which is useful later as an etch stop. An angled ion implantation process is then used to adjust the threshold voltages of the EEPROM devices at the floating gate channel, such that the threshold voltages of the floating gate and recall gate differ.

Referring to FIG. 5, a floating gate polysilicon layer is next conformally deposited and RIE recessed back to form continuous sidewall floating gates 59. The oxidized surface 57 of recall gate (RG) 56 is used as an etch stop. The floating gate polysilicon structure is recessed back to a level below coplanarity with the upper surface 41 of the substrate but still maintaining overlap with the sidewall diffusion 42. Next, a thin nitride (not shown) is conformally deposited. A mask is applied which allows the nitride film to be cut in the areas where segments of the continuous polysilicon floating gates (FG) on the first and second sidewalls of each trench are to be removed. The resultant discontinuity of floating gates is best seen from the plan view of FIG. 2b. The mask, which preferably comprises a resist, cuts orthogonally across each trench such that the floating gate polysilicon is redefined as discrete structures disposed along the first and second sidewall portions of each trench. Each discrete floating gate polysilicon structure 59 remains overlapping with an area of the upper N+ diffusion 42 in the P-well 44. In addition, each separate floating (FG) is preferably paired with another floating gate (FG) on the opposite sidewall portion of the same trench. Using the conformal nitride as a sidewall mask, the continuous floating gate polysilicon is oxidized away in unwanted areas, and the conformal nitride is subsequently stripped. As best visualized from FIG. 2b, this approach results in a silicon oxide spacer between adjacent floating gates on the first sidewall portion and between adjacent floating gates on the second sidewall portion of each trench.

Alternatively, polysilicon can be selectively removed from each trench sidewall using only the resist mask as a control to define the discrete floating gates. In etching polysilicon material cleanly between discrete floating gate structures, openings are created therebetween which will ultimately be filled by a silicon rich nitride material pursuant to the further processing steps described below (rather than a silicon oxide as in the above-described approach).

Figure 6:
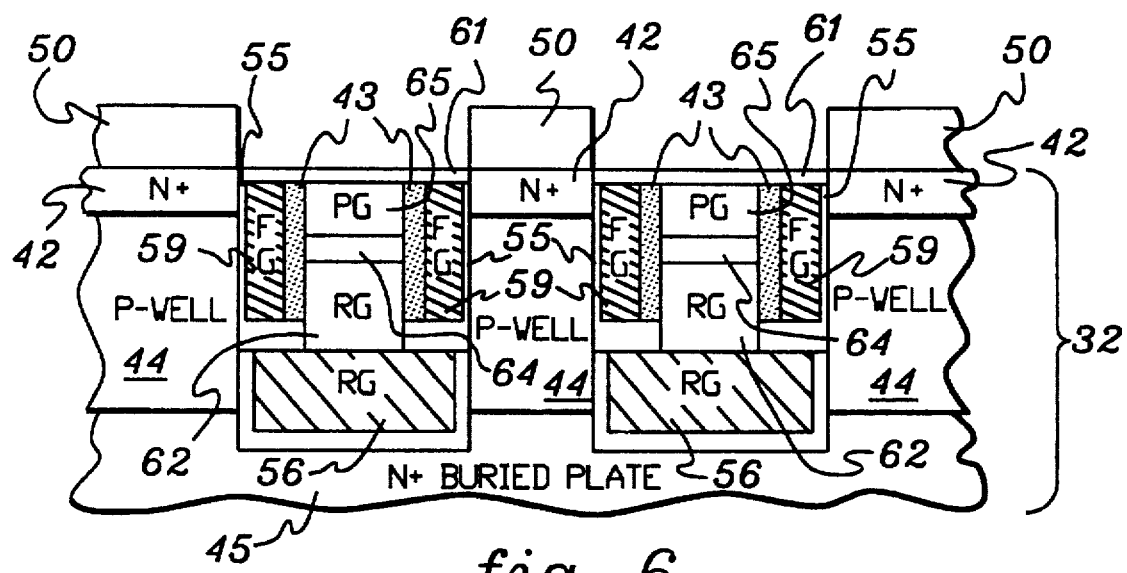
FIG. 6 is a partial cross-sectional view of the semiconductor structure of FIG. 5 subsequent additional fabrication processing pursuant to the present invention.

By continuing with processing pursuant to the present invention, a semiconductor structure such as that shown in FIG. 6 will be obtained. Initially, a nitride sacrificial material is used to conformally coat each EEPROM trench. This is followed by a resist fill and etch back to remove the conformal nitride down to the level of the top edge of the floating gate (FG) polysilicon 59. The resist is then stripped and exposed silicon on the top edge of each floating gate is oxidized 61 as are any exposed trench sidewalls extending above the floating gates. The sacrificial nitride is then removed.

A silicon rich nitride (SRN) is conformally deposited and RIE recessed back to form spacers 43 on the sidewalls of each floating gate. The silicon rich nitride is a composition having the imperical formula $Si_nN_4$, wherein n is a number between 3.3 and 4.5; e.g., a composite comprising silicon nitride, $Si_3N_4$, containing 10–50 atom percent excess of silicon. This material is described further by L. DoThanh et al. in "Injection Properties of Silicon-Rich Silicon Nitride Layers on $SiO_2$", *Insulating Films on Semiconductors J.* Simone and J. Buxo ed. North Holland (1986) Amsterdam, pp. 255–258, which is expressly incorporated herein by reference. Because silicon rich nitride (SRN) enhances the local electric field, it allows Fowler-Nordheim tunneling at lower average electric fields than conventional Fowler-Nordheim tunneling. In view of these lower average fields, there may be instances in which low field leakage of electrons from the floating gates (FG) may become a problem. In those cases, the SRN 43 may be CV deposited as a three layer "sandwich" comprising: a first layer of about 200 Å of SRN, a second layer of about 50–100 Å of $SiO_2$, and a third layer of about 200 Å of SRN. Because the function of the "sandwich" is the same as that of pure SRN in the practice of this invention, both are referred to by the term silicon rich nitride (SRN) layer throughout this application. Also, silicon rich oxide (SRO) could be used in place of SPAN, but it is more difficult to maintain the integrity of SRO through integrated processing sequences.

The silicon oxide on top of each recall gate (RG) is opened by an etch. This etch also removes a portion of the cap oxide on the top of each floating gate (FG).

Returning to FIG. 6, a polysilicon layer is next deposited, planarized by chemical-mechanical polishing and RIE recessed back into the trench to provide an extension 62 of the recall gate (RG). Although the two recall gate polysilicon masses 56 & 62 are deposited in separate steps, they perform the recall gate electrical function (described below) as a single unit. The surface of the recall gate extension 62 is oxidized to provide a silicon oxide layer 64. Once again, a polysilicon layer 65 is deposited, planarized and RIE recessed back to below the upper surface of substrate 32. Polysilicon layer 65 defines the program gates (PG) disposed between corresponding paired floating gate (FG) structures in each trench. Depending upon the location of the program gate, an oxide 61 may finally be deposited and planarized back to cap each trench. The non-erodible material 50 is subsequently stripped and processing continues (as is well known in the art) to connect the wordlines or control gates to each of the program gates disposed between floating gate (FG) pairs in the respective trenches. Also, bitline strap contacts 49 (FIG. 2b) are made to the shared diffusion regions between trenches.

Further processing includes providing contacts to the recall gates and program gates. These connections may be made in the EEPROM trenches where they pass outside the array. As shown in FIG. 2b the EEPROM trenches are typically continuous and the program and recall gates, which run the entire length of the trench, are common to the entire plurality of EEPROM memory cells disposed within each trench. Dummy, i.e., non-functional floating gates can be created at the connections of the EEPROM trenches which are outside the array during the course of the fabrication processing. If required, these non-functional floating gates could be cut out by the floating gate mask at the time the continuous floating gate is severed into the individual, discontinuous floating gates. Contacts to the recall gate (and the program gate) are accomplished with a mask that allows one to open the cap oxide and etch completely through the program gate (PG) as well as the cap oxide 64 on the recall gate (RG) and any floating gate (if it is present in the external connector). Oxide is subsequently deposited on all of the exposed areas except the top surface of the recall gate where electrical contact is established (see FIG. 2b). A second mask is used to open the oxide on top of the program gate in other areas (see FIG. 2b).

In operation, programming is achieved in each EEPROM memory cell by electrons tunneling (or more specifically Fowler-Nordheim tunneling) from the recall gate (RG) to the corresponding floating gate (FG) and re-programming (erasing) is achieved by electrons tunneling (i.e., Fowler-Nordheim tunneling) from the floating gate (FG) to the control/programming gate (PG). The program and re-program (erase) coupling ratios are different.

Figure 7:
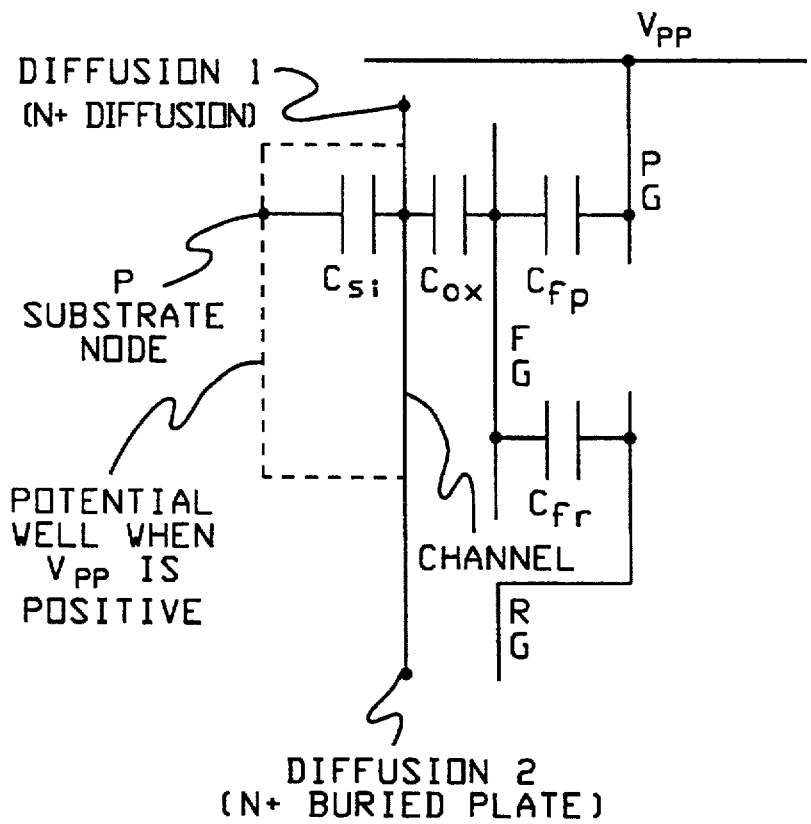
FIG. 7 is a device representation of the capacitive couplings formed between the various gates and the substrate regions of the EEPROM memory array embodiment of FIGS. 2a & 2b.

More specifically, and referring to FIG. 7, the write/read operating modes of an EEPROM memory cell such as that depicted in FIGS. 2a & 2b are next described. Again, the EEPROM memory cell of the present invention comprises a direct-write cell such that no, erase function is required. In this sense the EEPROM memory cells of the present invention comprise flash memory cells, i.e., cells which can be directly written in a flash. Again, however, a memory array fabricated pursuant to the present invention does not require an erase cycle prior to a write operation. Electrons flow through the insulator only when the information to be written is different from that stored on the floating gate. This automatically enhances cyclability at the device level.

The present EEPROM memory operates by modulating the substrate capacitance associated with the cell. When a positive voltage $V_{PP}$ is applied to the program/control gate (e.g., an on-chip generated 15–20 volts), a vertically disposed well is formed in the substrate (i.e., P-doped) region adjacent to the three-dimensional EEPROM cell. This well has a capacitance $C_{Si}$ between the channel of the field effect transistor and the substrate (P material) adjacent to the floating gate of the EEPROM device. If the associated N+ diffusion (herein referred to as "diffusion 1") is positive, electrons will be drained away in the adjacent substrate and the well capacitance comprises $C_{Si}$. Conversely, if "diffusion 1" is zero, the electrons remain in the substrate well and there is a surface channel N region maintained at zero volts. The well capacitance thus equals zero ($C_{Si}$=0) in this case since the channel only sees the zero voltage channel. The capacitance value $C_{Si}$ is much smaller than the gate oxide capacitance value $C_{OX}$.

Floating gate programming is relatively straightforward. With the applied voltage $V_{PP}$ at a positive value, e.g., 15 volts, the well in the adjacent substrate P region is formed and the value of N+ diffusion modulates the well capacitance $C_{Si}$. If the N+ diffusion (diffusion 1) is maintained at zero volts, then the well capacitance $C_{Si}$ equals zero and only the capacitance due to the thin oxide ($C_{OX}$) between the floating gate and the trench wall remains. Therefore, the floating gate, which is tightly coupled to the channel, stays close to zero volts (i.e., the channel voltage). There is a large enough voltage between the program gate (PG) and the floating gate (FG) for electrons to tunnel from the floating gate to the program gate because the injector threshold (which is typically 5–6 volts) is exceeded.

Conversely, if the N+ diffusion (diffusion 1) is at a plus voltage (for example, 3–5 volts), then the well in the substrate P-region is emptied of electrons and the associated floating gate (FG) is loosely coupled to the substrate via $C_{Si}$. In this case, the floating gate (FG) voltage rises close to that of the program gate potential ($V_{PP}$) and a large voltage difference appears across the floating gate/recall gate interface. Electrons therefore tunnel from the recall gate (RG) to the floating gate (FG).

Because in this embodiment of the present invention diffusion 1 is a shared diffusion between two EEPROM cells disposed in different but adjacent trenches, there is a complication. The floating gate on either side of the N+ diffusion will be programmed with the same information. Therefore, the recall gate of the EEPROM cell to remain unchanged must rise to an inhibit voltage (e.g., approximately 10 volts). This will prevent programming but will still cause a channel to be formed between diffusion 1 and the N+ buried plate (diffusion 2) in the substrate adjacent the substrate's P-well region (i.e., during programming). To prevent this, the voltage due to the recall gate ($V_{t2}$) needs to be raised relative to the voltage under the floating gate (i.e., $V_{t1}$) (see FIG. 2a). In this regard, raising the N+ buried plate voltage to a higher voltage level during programming would be a helpful modification since the recall voltage ($V_{t2}$) can then be a lower value and still accomplish the inhibit function. Such an approach would be particularly desirable during a read operation.

FIG. 8 schematically depicts the capacitive network, generally denoted 70, identified with the structure of FIG. 7. In network 70, the programming gate (PG) is coupled to the floating gate (FG) via a capacitance $C_{fp}$ and the floating gate (FG) is coupled to the P-well substrate node P via a capacitance $C_{OX}$ in series with the well capacitance $C_{Si}$, which again is variable and depends upon the diffusion 1 bias. A simplified version of the FIG. 8 capacitive schematic is set forth in FIG. 9. In FIG. 9, the variable capacitance C is defined as follows:

$$C = \frac{C_{OX}C_{Si}}{C_{OX} + C_{Si}}$$

Wherein when N+ diffusion 1=+voltage, then:

$C_{Si}$ is present, and
$C_{Si} \ll C_{OX}$, $C \approx C_{Si}$,

Alternatively, when N+ diffusion 1=0 voltage, then:

$C_{Si}$ is not present, and $C = C_{OX} \equiv$ floating gate to channel oxide capacitance.

Operating modes for the EEPROM memory cells in an array such as that partially depicted in FIGS. 2a & 2b are set forth below in Table 1.

TABLE 1

| OPERATING MODES: | | SELECT | NON-SELECT | IN-HIBIT |
|---|---|---|---|---|
| WRITE: | PROG./CONTROL GATE | $V_{PP}$ | 0 | $V_{PP}$ 0 |
| | RECALL GATE | 0 | 0 | $V_{RI}$ $V_{RI}$ |
| | DIFFUSION | $V_{DD}$/0 | $V_{DD}$/0 | $V_{DD}$/0 |
| READ: | PROG./CONTROL GATE | $V_{SEL}$ | 0 | |
| | DIFFUSION | $V_{DD}$ | 0 | |

The three-dimensional EEPROM cell presented in FIGS. 2a & 2b is significantly denser than any conventional two-dimensional, above the substrate EEPROM cell known in the art, and therefore it provides improved performance for a given chip area. (Those skilled in the art will recognize that any embodiment of the direct-write EEPROM cells disclosed herein could also reside partially or totally above the upper surface of the substrate.) Use of a silicon rich dielectric further makes it possible to build such a structure by allowing controlled poly to poly tunneling inside the trench. Capacitance modulation of the substrate results in (or facilitates) large change in floating gate to substrate capacitance. The recall gate isolates the floating gate region and breaks the path to the substrate. Further, the recall gate allows a read to take place by completing the device path (vertically) controlled by the floating gate and recall gate voltages ($V_{t1}$) & ($V_{t2}$) (see FIG. 2a).

Relatively low operational electric fields are also possible due to local field enhancement resulting from use of the silicon rich dielectric injectors. In addition, high write performance is possible because of the combination of high local fields and low average maximum fields. Further, the vertical channel has two separate control voltage regions, (i.e., ($V_{t1}$) and ($V_{t2}$). When voltage control ($V_{t2}$) is set high enough the recall gate voltage comprises an inhibit voltage and prevents the turn on of the vertical channel region. On "selected" bitlines, the common N+ diffusions (diffusion 1) and the N+ buried plate in the substrate are placed at the same voltage.

Figure 10A:
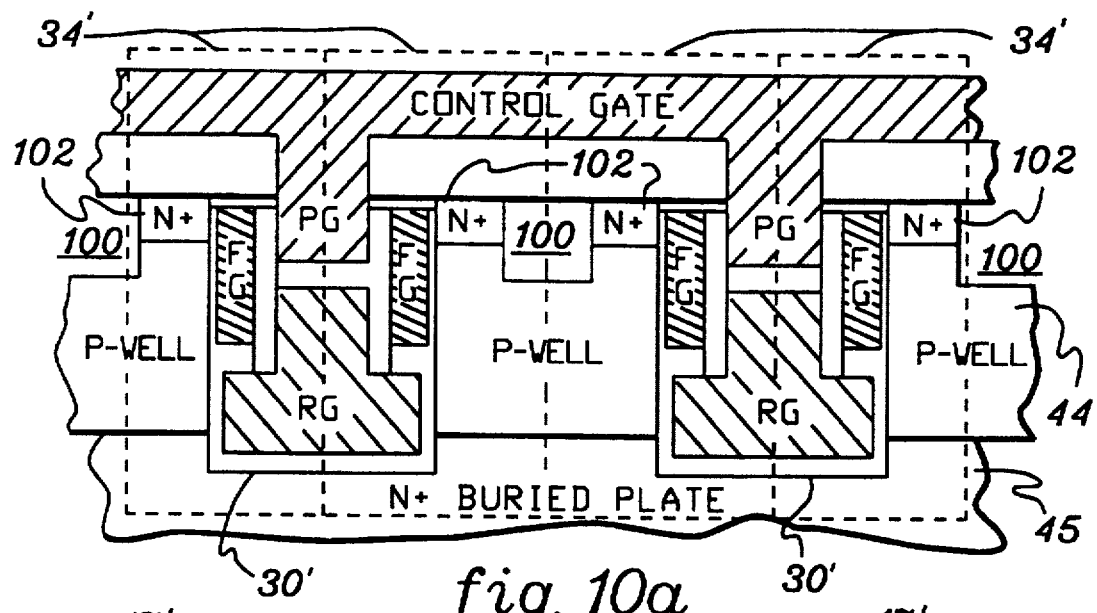
FIG. 10a is a partial cross-sectional view of an alternate embodiment of a direct-write EEPROM memory array pursuant to the present invention.
Figure 10B:
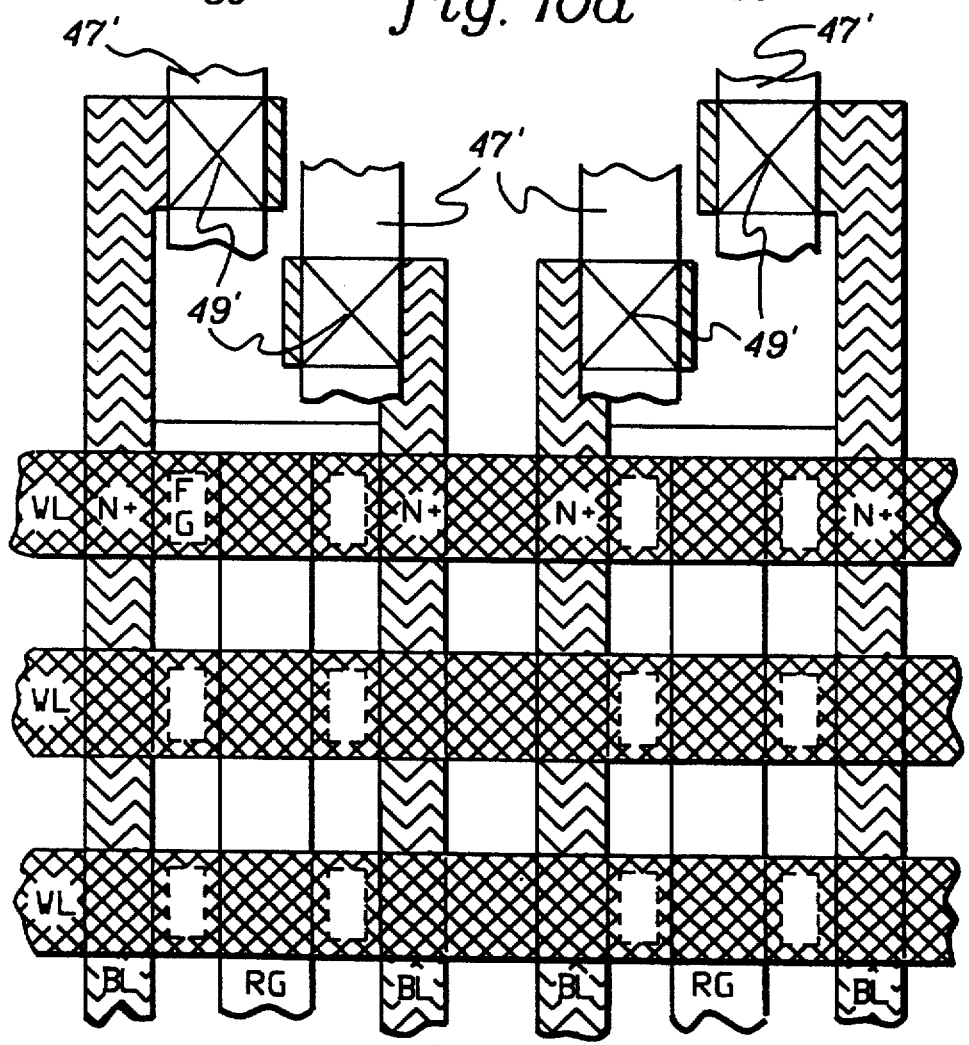

Although an EEPROM memory array constructed pursuant to the above-described technique is dense, the requirement of an inhibit voltage between adjacent wells to prevent writing of the same information to the floating gates coupled to the same diffusion can be a complication. Also, the substrate channel must have two threshold voltages, ($V_{t1}$) and ($V_{t2}$) for proper operation of the inhibit function. FIGS. 10a & 10b introduce an alternate embodiment of an EEPROM memory cell and array pursuant to the present invention. The cross-sectional and plan views of FIGS. 10a & 10b depict a direct-write EEPROM memory cell/array substantially identical to that described above in connection with FIGS. 2a & 2b. However, an oxide isolation 100 is added to divide the common diffusions 42 of the first embodiment (FIGS. 2a & 2b) into two separate, narrower diffusions 102 in the substrate between adjacent elongated cells 34'. To accomplish this, the trenches 30' are preferably spaced slightly further apart (e.g., 0.2µ) in comparison with trenches 30 of the FIGS. 2a & 2b direct-write EEPROM array embodiment. Each separate, isolated diffusion 102 is then dedicated to a particular EEPROM memory cell 34' within the array.

Since the diffusions are now independent it is possible to select a single program gate (PG) and write every device in the row selecting every trench and writing a unique "1" or "0" into each selected floating gate (FG). There is no need for the recall gate (RG) inhibit function, although the function could be used to block rewrite of selected bits in a byte as a product feature. In this embodiment, the bitline strapping can become a pitch limiter in the direction perpendicular to the trenches (i.e., unless two strap layers 47' are used to contact 49' the two isolated diffusions between adjacent parallel trenches, as shown in FIG. 10b). Other than the oxide isolation, the structures depicted in FIGS. 10a & 10b and their operation are substantially identical to those described above with respect to the direct-write EEPROM array of FIGS. 2a & 2b. However, the preliminary processing to achieve the direct-write EEPROM structure of FIGS. 10a & 10b is somewhat different.

Figure 11A:
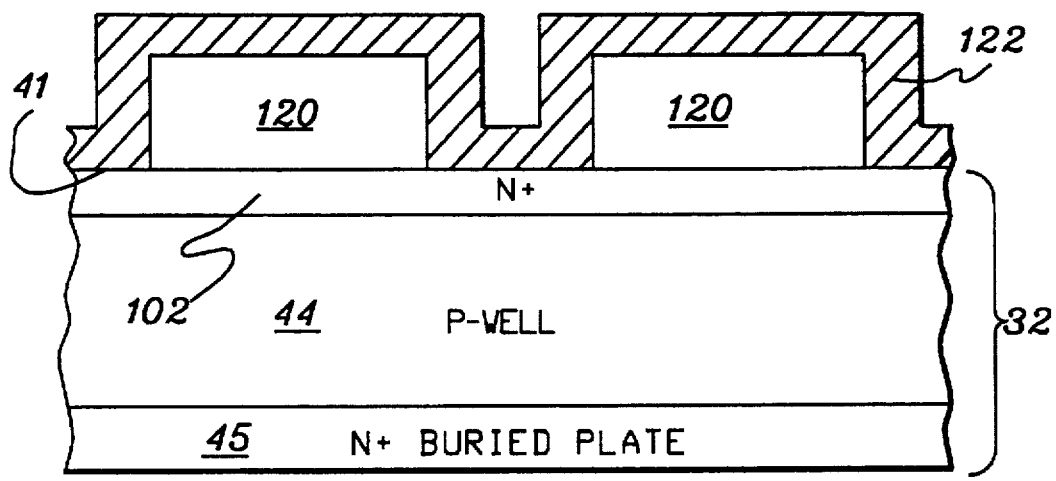
FIG. 11a is a partial cross-sectional view of a semiconductor structure attained at an early stage of fabrication processing (pursuant to the present invention) of an EEPROM memory array such as that depicted in FIGS. 10a & 10b.

The unique fabrication processing of a non-shared diffusion type EEPROM memory device such as that presented in FIGS. 10a & 10b is next described. The wafer 32 is assumed to contain an N+ diffusion 102 (from an upper surface) in a P-well 44 (P doped Si) which extends to contact an N+ buried plate 45. As shown in FIG. 11a, upper surface 41 of the wafer is initially patterned for the formation of the elongated trench regions 30' (see FIG. 10a). Each trench region is defined by a silicon oxide (SiO$_2$) 120 over which a conformal layer 122 (e.g., Si$_3$N$_4$, although other combinations can be used) is deposited as shown.

Figure 11B:
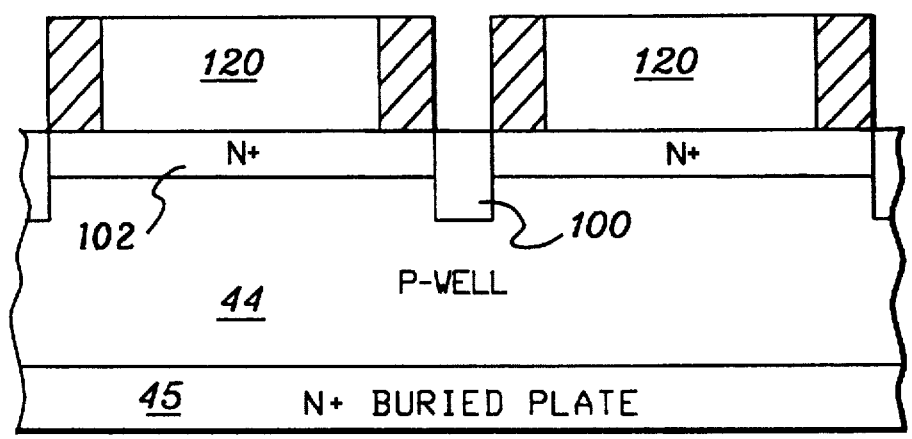
FIG. 11b is a partial cross-sectional view of the semiconductor structure of FIG. 11a subsequent additional fabrication processing pursuant the present invention.
Figure 11C:
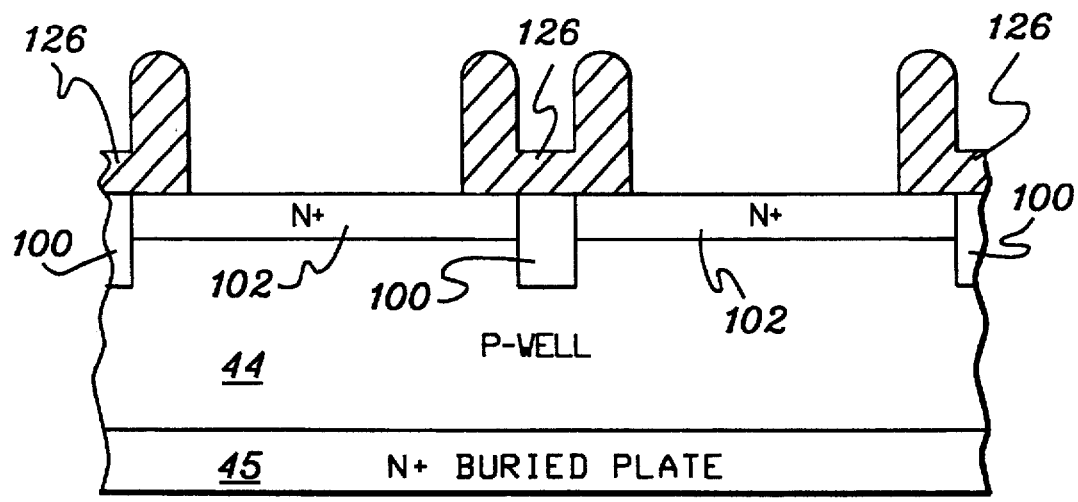
FIG. 11c is a partial cross-sectional view of the semiconductor structure of FIG. 11b subsequent additional fabrication processing pursuant to the present invention.

Directional etching of the semiconductor structure of FIG. 11a results in the oxide/spacer combination shown in FIG. 11b. In addition, an isolation oxide 100 has been formed in wafer 32 so as to extend through N+ diffusion region 102. Oxide 100 is located to reside between the substrate trenches to be formed below silicon oxide 120. FIG. 11c depicts the semiconductor structure of FIG. 11b after the silicon oxide 120 has been removed, e.g., by vaporization techniques. In addition, a silicon nitride cap 126 has been placed over each oxide isolation 100.

Those skilled in the art will recognize that various alternate direct-write EEPROM cell/array embodiments utilizing the inventive concepts presented herein are possible. FIG. 12 partially depicts in cross-sectional view one such alternate embodiment.

In this case, the recall gate (RG) 130 is placed in a trench after the deposition of the associated floating gates 132. The initial processing steps are the same as in the above-described embodiments up to the point of cutting the EEPROM trench in the semiconductor substrate. However, in this embodiment, the EEPROM trench is displaced slightly so as to provide a second lower trench (discussed below). A trench 134 is etched through an N+ diffusion 136 into P-well 138, but not into N substrate 140. The walls and floor of trench 134 are oxidized as before and a polysilicon layer is deposited, planarized and recessed back in the trench to form two continuous sidewall floating gates 132 which have exposed top and side surfaces. The top surface is partially overlapping the sidewall N+ diffusion regions 136 but below the level of non-erodible mask 142.

The sidewall floating gates are cut as before along parallel lines orthogonal to the parallel elongate trenches. A nitride sacrificial material is used to conformally coat the EEPROM trench. This is followed by a resist fill and etch back to remove the conformal nitride down to the level of the top edge of the floating gate 132 polysilicon. The resist is stripped and the exposed silicon on the top edge of the floating gates 132 and the sidewalls of the trench above the floating gates are oxidized. The sacrificial nitride layer is stripped. A silicon rich nitride layer is conformally deposited and RIE etched to form spacers along the sidewalls of the floating gates. An SiO$_2$ spacer (to protect the silicon rich nitride layer) is next defined.

Using the SiO$_2$ thermally grown on the top of the floating gate a second trench 146 is etched into the N+ buried plate 140. An angled ion implant is preferably done to adjust or improve the $V_T$ of the recall gate device to be formed. In this manner the $V_T$ of the lower portion can be separately adjusted as needed. A gate oxide is formed on the lower trench surface. Polysilicon is deposited and recessed to form a recall gate 130 which fills the lower trench and extends about half way up the silicon nitride layer on the side surface of the floating gates 132. The top surface of the recall gate polysilicon is oxidized 148 and the program gate 150 polysilicon is deposited, planarized and recessed below the boundary between the first non-erodible mask 142 and the surface P layer. Finally, the non-erodible masks are removed and the resulting cavity filled with oxide 152 up to the level of the surface of the semiconductor. Silicon rich oxide may be used instead of silicon rich nitride to achieve the direct write EEPROM operation.

The direct-write EEPROM memory cell/arrays presented herein have several advantages over existing EEPROM devices and in particular over existing flash-EEPROMs. As explained initially, flash-EEPROM memory cells are simultaneously erased in large blocks (or even erased on a chip level) so that the memory cells can be implemented using a single scalable device for the lowest possible cost. Write operations at the byte or page level are sacrificed to achieve a lower cost device. Further, write requires erasure of a large block (e.g., 64k bytes) regardless of the size of the data to be changed. This has significant implications with respect to the energy required to make a given change and the number of cycles required for the change. In comparison, the inventive circuits provided herein attain greater density than flash-EEPROM devices while still preserving the flexibility of EEPROMs. Also, since each of the memory cells/arrays described are direct-write, no erase function is required prior to a write operation. Direct-write capability is available only in a few limited EEPROMs today with two-dimensional cells, all of which are of a much lower density than the circuits presented herein. Table 2 sets forth an example of the lower energy associated with direct-write byte and/or page mode EEPROMs versus conventional flash-EEPROMs, again which must operate on a large block of data (e.g., 64k bytes for an eight megabit chip is typical of a block erase size).

TABLE 2

| DEVICE | POWER DISSIPATION | TIME | ENERGY |
| --- | --- | --- | --- |
| Direct-Write EEPROM | 0.1 W | 5 ms | 0.5 m Joule |
| Flash-EEPROM | 0.25 W | 1.25 s | 0.3 Joule |

This required energy parameter is crucial for battery operated systems. As can be seen from Table 2, the energy savings with the direct-write EEPROMs of the present invention is on the order of 600× for the same density circuit as required by available flash-EEPROMs.

TABLE 3

| Data to be changed | EEPROM Direct-Write | | EEPROM Non-Direct Write (# cycles) | FLASH Non-Direct Write (# cycles) | RATIO OF CYCLES | | |
| --- | --- | --- | --- | --- | --- | --- | --- |
| | 10% Data New (# cycles) | 50% Data New (# cycles) | | | | | |
| | (A) | (B) | (C) | (D) | D/C | D/B | D/A |
| 1 Byte | 0.1 | 0.5 | 1 | 64K | 64K | 128K | 640K |
| 1 Page of 512 Bytes | 0.1 | 0.5 | 1 | 128 | 128 | 256 | 1280 |
| 1 Page of 4096 Bytes | 0.1 | 0.5 | 1 | 16 | 16 | 32 | 320 |

Table 3 defines an example of the number of cycles required to change a byte or a page of information in a direct-write EEPROM pursuant to the present invention in comparison with non-direct-write EEPROMs and conventional flash-EEPROMs. As indicated, with a conventional EEPROM and/or a conventional flash-EEPROM every cell is changed regardless of whether the new data is the same or is different from the information already stored in the corresponding memory cell. Conversely, with a direct-write EEPROM cell implementation, a cycle is required only where data is changed. This is inherent in the cell design and requires no circuit intervention to achieve. Two different examples, one with ten (10%) percent and the other with fifty (50%) percent change in data are set forth. Because the direct-write EEPROM cell only requires a cycle if data is to be changed, less cycles are required and therefore the expected life of a direct-write EEPROM array pursuant to the present invention is significantly greater than that of a flash-EEPROM array. (The flash-EEPROM is assumed to require erasure of 64k bytes and the number of cycles to change data depends upon the organization of the flash-EEPROMs in terms of the byte write or page write request. Most flash-EEPROMs have byte size write capability.)

From Table 3, therefore, it can be seen that for a byte write operation in a flash-EEPROM, 64k more cycles are required to write a byte than in the case of a direct-write EEPROM pursuant to the present invention. For a page organized write, the flash-EEPROM will require 32 to 1280 more cycles than a direct-write EEPROM. Thus, the present invention provides a product as dense as a flash-EEPROM, but for which rewrites require a magnitude less cycles than the conventional block erase one byte write flash-EEPROM.

Those skilled in the art will recognize that the non-volatile, three-dimensional, direct-write EEPROM cells/arrays and fabrication methods presented herein meet the advantages initially set forth. Specifically, the EEPROM memory cells and arrays of the present invention are direct-write, therefore no erase cycle (with all the associated performance disadvantages thereof) is required. Further, operation of the cell/array presented only requires a low standard voltage supply, e.g., approximately 3–5 volts applied to the chip. The diffusions operate between 0 and 3–5 volts. Since Fowler-Nordheim tunneling conventionally requires high voltage (but low current) between respective poly-lines, silicon rich dielectric injection is employed to increase the local fields at a given voltage thus reducing the on-chip voltage boosting requirements. Low current Fowler-Nordheim tunneling is used for programming and re-programming, thus lowering circuit power consumption (in comparison with hot electron writing of cells).

In addition, the three-dimensional structure is much denser than any EEPROM array attainable with a two-dimensional, horizontal-type implementation. Further, capacitive modulation of the substrate facilitates large changes in the floating gate to substrate capacitance with a small diffusion voltage swing. In a shared diffusion type embodiment, the recall gate is utilized to isolate the floating gate and break any potential path of current to the substrate. High write performance is attainable with the combination of high local fields and low average maximum fields. In certain embodiments, a single non-erodible mask is used in the EEPROM array fabrication process pursuant to the present invention, While the invention has been described in detail herein in accordance with certain preferred embodiments thereof, many modifications and changes therein may be affected by those skilled in the art. Accordingly, it is intended by the appended claims to cover all such modifications and changes as fall within the true spirit and scope of the invention.

We claim:

1. A direct-write EEPROM memory array formed in a semiconductor substrate, said memory array comprising:

a first elongated trench formed in the semiconductor substrate;

multiple vertical direct-write EEPROM cells disposed in said first elongated trench, one of said EEPROM cells being paired within said first elongated trench with another of said EEPROM cells such that paired EEPROM cells are disposed in said first elongated trench, the paired EEPROM cells being disposed on respective opposing walls of the elongated trench; and at least one control gate disposed within said first elongated trench, said paired EEPROM cells sharing a control gate of said at least one control gate, at least a portion of the shared control gate of said at least one control gate comprising a single electrically continuous gate structure disposed in the trench between, and in operative relationship with, the paired EEPROM cells, the shared control gate of the at least one control gate being in electrical contact with a line structure crossing the first elongated trench to thereby operate each EEPROM cell of the paired EEPROM cells; and an electrically continuous diffusion structure associated with said first elongated trench, said electrically continuous diffusion structure comprising either a source node or a drain node for each of at least two vertical direct-write EEPROM cells of said multiple vertical direct-write EEPROM cells disposed in said first elongated trench.

2. The direct-write EEPROM memory array of claim 1, further comprising:
- a plurality of substantially parallel, elongated trenches adjacently formed in the semiconductor substrate, said plurality of elongated trenches including said first elongated trench; and
- a plurality of vertical EEPROM cells disposed within said plurality of elongated trenches, multiple vertical EEPROM cells being disposed within each of said plurality of elongated trenches.

3. The direct-write EEPROM memory array of claim 2, wherein:
- each of said multiple EEPROM cells disposed in each of said plurality of elongated trenches is paired with another of said EEPROM cells disposed in the same elongated trench such that EEPROM cell pairs are disposed in said plurality of elongated trenches; and
- a plurality of discrete control gates are disposed within said plurality of elongated trenches, each control gate being shared by one of said EEPROM cell pairs.

4. The direct-write EEPROM memory array of claim 2, wherein each vertical EEPROM cell is configured to share a common diffusion with an EEPROM cell in an adjacent elongated trench.

5. The direct-write EEPROM memory array of claim 3, wherein each of said multiple vertical EEPROM cells in each of said elongated trenches shares a common diffusion with an EEPROM cell in an adjacent trench.

6. The direct-write EEPROM memory array of claim 1, wherein said EEPROM cells require an external voltage supply to be programmed, said external voltage supply being less than six volts.

7. A memory cell array formed relative to a surface of a semiconductor substrate, said memory cell array comprising:
- at least two elongated, substantially parallel adjacent trenches formed relative to said surface of said substrate, each of said elongated trenches having a bottom portion, first and second side portions, and a top portion;
- at least two first electrodes, each of said first electrodes being elongated and disposed at said bottom portion of one of said elongated trenches such that each trench contains a first electrode, each of said first electrodes having a first surface portion;
- at least two second electrodes, each of said second electrodes being disposed at said first side portion of one of said elongated trenches such that each trench contains a second electrode, each of said second electrodes having a second surface portion disposed adjacent said first surface portion of a respective one of said first electrodes for receiving injected electrons therefrom, and each of said second electrodes having a third surface portion;
- at least two third electrodes, each of said third electrodes being disposed at said second side portion of one of said elongated trenches such that each trench contains a third electrode, each of said third electrodes having a second surface portion disposed adjacent said first surface portion of a respective one of said first electrodes for receiving injected electrons therefrom, and each of said third electrodes having a third surface portion;
- at least two fourth electrodes, each of said fourth electrodes being disposed at said upper portion of one of said elongated trenches such that each trench contains a fourth electrode, each of said fourth electrodes being an electrically continuous gate structure disposed between, and in operative relationship with, a respective pair of second and third electrodes, each of said fourth electrodes having a fourth surface portion disposed adjacent said third surface portions of respective ones of said second and third electrodes for receiving electrons injected therefrom, each of said fourth electrodes being in electrical contact with a line structure crossing the two elongated trenches; and
- an elongated diffusion region, said diffusion region being disposed between adjacent ones of said at least two elongated trenches, said elongated diffusion region being coupled to a signal source.

8. The memory cell array of claim 7, wherein:
- a plurality of elongated, substantially parallel adjacent trenches are formed relative to said surface of said substrate, each of said elongated trenches having a bottom portion, first and second side portions, and a top portion; and
- a plurality of first electrodes, second electrodes, third electrodes and fourth electrodes are provided, each of said plurality of first electrodes, second electrodes, third electrodes and fourth electrodes being associated with one of said plurality of elongated trenches.

9. The memory cell array of claim 8, wherein each of said plurality of trenches comprises a shallow trench formed in said surface of said substrate.

10. The memory cell array of claim 8, wherein said memory cell comprises an EEPROM cell and said first electrodes comprise recall gates, said second electrodes and said third electrodes comprise floating gates and said fourth electrodes comprise program gates.

11. The memory cell array of claim 10, wherein each of said plurality of elongated trenches includes multiple second electrodes disposed at said first side portion of said trench and multiple third electrodes disposed at said second side portion of said trench, each of said second electrodes being paired with one of said third electrodes.

12. The memory cell array of claim 11, wherein each of said plurality of elongated trenches includes multiple fourth electrodes, each of said fourth electrodes being associated with one of said second electrode and third electrode pairs.

13. The memory cell array of claim 12, further comprising a plurality of interconnection lines disposed above and orthogonal to said plurality of elongated trenches, the plurality of interconnection lines including the crossing line structures, each of said plurality of interconnection lines being coupled to respective ones of said plurality of fourth electrodes disposed therebeneath.

14. The memory cell array of claim 13, wherein said plurality of interconnection lines comprise wordlines and said elongated diffusion regions comprise bitlines, said wordlines and said bitlines allowing access to selected memory cells in said array.

15. The memory cell array of claim 8, wherein at least one elongated diffusion region pair is provided, each of said elongated diffusion region pairs comprising two distinct elongated diffusion regions, and each of said diffusion region pairs being disposed between adjacent ones of said at least two elongated trenches, each of said distinct elongated diffusion regions being coupled to a separate signal source.

16. The memory cell array of claim 15, wherein said two separate elongated diffusion regions of each of said diffusion region pairs are separated by an oxide isolation.

17. The memory cell array of claim 7, wherein each of said second electrodes and said third electrodes comprises an isolated floating gate.

18. The memory cell array of claim 17, wherein said second electrodes and said third electrodes are each partially isolated from a corresponding one of said first electrodes by a silicon rich nitride or a silicon rich oxide.

19. The memory cell array of claim 16, wherein said second electrodes and said third electrodes are each partially isolated from a corresponding one of said fourth electrodes by a silicon rich dielectric.

20. The direct-write EEPROM memory array of claim 1, wherein the crossing line structure comprises at least a portion of a word line of said EEPROM memory array.

21. The direct-write EEPROM memory array of claim 20, wherein the electrically continuous diffusion structure comprises at least a portion of a bit line of said EEPROM memory array.

22. The memory cell array of claim 18, wherein the array requires a voltage supply to be programmed, said voltage supply being less than six volts.

23. The memory cell array of claim 19, wherein the array requires a voltage supply to be programmed, the voltage supply being less than six volts.

* * * * *

UNITED STATES PATENT AND TRADEMARK OFFICE
CERTIFICATE OF CORRECTION

PATENT NO. : 5,617,351

DATED : Apr. 1, 1997

INVENTOR(S) : Bertin et al.

It is certified that error appears in the above-indentified patent and that said Letters Patent is hereby corrected as shown below:

Col. 6, line 57        "Of" should be --of--.

Col. 7, line 67        "One" should begin new paragraph, --   One--.

Signed and Sealed this

Second Day of September, 1997

Attest:

BRUCE LEHMAN

Attesting Officer    Commissioner of Patents and Trademarks